(12) United States Patent
Steffens

(10) Patent No.: US 11,143,683 B1
(45) Date of Patent: Oct. 12, 2021

(54) MEASURING METHOD AND MEASURING ARRANGEMENT

(71) Applicant: Rohde & Schwarz GmbH & Co. KG, Munich (DE)

(72) Inventor: Johannes Steffens, Rosenheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/915,085

(22) Filed: Jun. 29, 2020

(51) Int. Cl.
*G01R 31/00* (2006.01)
*G01R 29/08* (2006.01)
*C08J 5/04* (2006.01)

(52) U.S. Cl.
CPC ....... *G01R 31/001* (2013.01); *G01R 29/0814* (2013.01); *G01R 29/0878* (2013.01); *C08J 5/042* (2013.01)

(58) Field of Classification Search
CPC .............. G01R 31/001; G01R 29/0814; G01R 29/0878; C08J 5/042
USPC .......................................................... 324/612
See application file for complete search history.

(56) References Cited

U.S. PATENT DOCUMENTS

| | | | | | |
|---|---|---|---|---|---|
| 6,008,753 A | * | 12/1999 | Berg | ...................... | H01Q 15/14 342/165 |
| 6,031,498 A | * | 2/2000 | Issler | ...................... | G01R 29/10 342/351 |
| 2005/0147804 A1 | * | 7/2005 | Harada | .................... | F16F 7/124 428/292.1 |
| 2006/0202882 A1 | * | 9/2006 | Noda | .................... | H05K 9/0083 342/1 |
| 2006/0255998 A1 | * | 11/2006 | Hirata | ................ | G01R 29/0878 342/1 |

OTHER PUBLICATIONS

Meier, Dominik, et al. "Propagation of millimeter waves in composite materials." IEEE Transactions on Antennas and Propagation 68.4 (2019): 3080-3093. (Year: 2019).*

(Continued)

*Primary Examiner* — Christopher P McAndrew
(74) *Attorney, Agent, or Firm* — Westman, Champlin & Koehler, P.A.

(57) ABSTRACT

A measuring method for locating an imperfection in an electrically conductive material comprises applying an electric input signal with an electric signal generator to the electrically conductive material such that the electrically conductive material acts as an antenna and thereby transmits an electromagnetic output signal having a frequency spectrum comprising a contributing frequency corresponding to the imperfection within the electrically conductive material; receiving the electromagnetic output signal with an antenna detection system, wherein the antenna detection system probes the frequency spectrum of the electromagnetic output signal as a function of at least one of position and direction; and locating the imperfection within the electrically conductive material by analyzing with an analysis device a spatial origin of the contributing frequency within the frequency spectrum of the received electromagnetic output signal.

17 Claims, 1 Drawing Sheet

(56) References Cited

OTHER PUBLICATIONS

Li, Zhen et al., "A Review of the Radio Frequency Non-destructive Testing for Carbon-fibre Composites", Measurement Science Review, 16 (2016), No. 2, 68-76, De Gruyter OPEN, ISSN 1335-8871, Journal homepage: http://www.degruyter.com/view/j/msr, DOI: 10.1515/msr-2016-0010, 9 pages.

Matsuzaki, Ryosuke et al., "Antenna/sensor multifunctional composites for the wireless detection of damage", Composites Science and Technology 69 (2009) 2507-2513, Contents lists available at ScienceDirect, Composites Science and Technology, journal homepage: www.elsevier.com/ locate/compscitech, 7 pages.

Salski, B. et al., "Portable Automated Radio-Frequency Scanner for Non-destructive Testing of Carbon-Fibre-Reinforced Polymer Composites", J Nondestruct Eval (2016) 35:25, DOI 10.1007/s10921-016-0343-y, CrossMark, Springer, 8 pages.

Li, Zhen et al., "Principles and Applications of Microwave Testing for Woven and Non-Woven Carbon Fibre-Reinforced Polymer Composites: a Topical Review", Applied Composite Materials (2018) 25:965-982, https://doi.org/10.1007/s10443-018-9733-x, CrossMark, Springer, 18 pages.

Matsuzaki, R. et al., "Wireless Damage Detection of CFRP Using Self-Antenna Technology", Tokyo Institute of Technology, 2-12-1 O-okayama, Meguro, Tokyo, 1528552, Japan, rmatsuza@ginza.mes.titech.ac.jp, 10 pages.

\* cited by examiner

MEASURING METHOD AND MEASURING ARRANGEMENT

TECHNICAL FIELD

The present invention relates to a measuring method for locating an imperfection in an electrically conductive material. The present invention further relates to a respective measuring arrangement.

BACKGROUND

Although applicable in principal to various electrically conductive materials, the present invention and its underlying problem will be hereinafter described in relation to carbon-fiber composites.

Carbon-fiber reinforced plastic composites (CFRP) have been widely used in civil engineering and the transportation industry, e.g. for aerospace and automotive structural applications, due to their superior stiffness and strength characteristics, structural efficiency, fatigue and corrosion resistance. Various non-destructive testing (NDT) techniques have been applied to characterize the properties of such composites and to identify manufacturing imperfections and in-service damage within components formed from such materials. Common NDT approaches rely amongst others on acoustic emission, ultrasonic testing, eddy currents, thermography, shearography, vibration testing, X-ray tomography, optical fiber sensors, Lamb waves, terahertz imaging and/or microwave techniques.

Li et al., "A Review of the Radio Frequency Non-destructive Testing for Carbon-fibre Composites," Measurement Science Review, vol. 16, p. 68-76, 2016, provides an overview of recent research on the various NDT techniques used to test CFRP materials.

It has been suggested recently to exploit the high electrical conductivity of carbon fibers and model CFRP structures as antennas. The electric properties of CFRP structures vary in accordance with damage such as fiber breakage or delamination, which thus also affects the behavior of the structure acting as an antenna. This change in the antenna property due to damage can be observed wirelessly at a remote location, and it provides information on the damage.

For example, Matsuzaki et al., "Antenna/sensor multifunctional composites for the wireless detection of damage," Composites Science and Technology, vol. 69, p. 2507-2513, 2009, describes building a dipole antenna from two woven CFRP laminates. The CFRP material itself is used as a monitoring system by wirelessly detecting radio waves emitted from this transmitting antenna with a stationary aluminum dipole antenna as receiving antenna. However, this approach is not able to adequately resolve a location of the damage.

SUMMARY

Against this background, there is a need to provide a measuring method with improved spatial resolution.

To this end, the present invention provides a measuring method and a measuring arrangement with the features of the independent claims.

According to a first aspect, a measuring method for locating an imperfection in an electrically conductive material comprises applying an electric input signal with an electric signal generator to the electrically conductive material such that the electrically conductive material acts as an antenna and thereby transmits an electromagnetic output signal having a frequency spectrum comprising a contributing frequency corresponding to the imperfection within the electrically conductive material; receiving the electromagnetic output signal with an antenna detection system, wherein the antenna detection system probes the frequency spectrum of the electromagnetic output signal as a function of at least one of position and direction; and locating the imperfection within the electrically conductive material by analyzing with an analysis device a spatial origin of the contributing frequency within the frequency spectrum of the received electromagnetic output signal.

According to a further aspect, a measuring arrangement for locating an imperfection in an electrically conductive material comprises an electric signal generator configured to apply an electric input signal to the electrically conductive material such that the electrically conductive material acts as an antenna and thereby transmits an electromagnetic output signal having a frequency spectrum comprising a contributing frequency corresponding to the imperfection within the electrically conductive material; an antenna detection system configured to the receive the electromagnetic output signal, wherein the antenna detection system is configured to probe the frequency spectrum of the electromagnetic output signal as a function of at least one of position and direction; and an analysis device configured to locate the imperfection within the electrically conductive material by analyzing a spatial origin of the contributing frequency within the frequency spectrum of the received electromagnetic output signal.

The present invention is based on the insight that imperfections within the conductive material are associated with corresponding characteristic frequencies within the frequency spectrum of the material acting as an antenna. Or in other words, the emitted radio spectrum of the antenna correlates with the properties of the imperfections, e.g. size, shape, type, etc. of the defective area within and/or on the material. Hence, different damaged or defective areas of the material may be distinguished from each other by studying the emitted radiation, in particular its frequency spectrum. By providing an antenna system with positional and/or directional sensitivity, different affected areas may thus be localized by analyzing the spatial origin of the respective frequencies within the emitted radiation. As a result, a simple and low-cost solution is provided with improved spatial resolution compared to the prior art.

Further embodiments of the present invention are subject of the subordinate claims and of the following description, referring to the drawings.

According to an embodiment, the electric input signal may comprise a frequency-modulated signal.

For example, the antenna detection system may comprise a receiver, which may be coupled to the antenna(s) of the antenna detection system and which may be configured to demodulate the received electromagnetic output signal. The output signal may be affected by the imperfections within the conductive material (acting as an antenna) in a characteristic way, which may allow to reconstruct and/or draw conclusions about the properties of the imperfections.

According to an embodiment, a signal frequency of the electric input signal may be changed over time. Correspondingly, the signal generator may be configured to change a signal frequency of the electric input signal over time.

For example, the power of the contributing frequency may be detected on basis of such a variation of the signal frequency, which may help to determine which frequencies are resonant frequencies of the imperfection(s). To this end, the antenna detection system may be connected to a power detector, in which specific characteristic frequencies may be reconstructed.

According to an embodiment, the electric input signal may be a chirp signal.

In case of a chirp signal, also called frequency sweeping, the frequency of a signal increases or decreases continuously with time. A chirp signal is one particular advantageous example for a signal modulation that allows the antenna behavior to be observed over frequency. For example, a maximum within the received signal may be visible at one or several frequencies due to a resonance of the antenna (i.e. of the electrically conductive material and its imperfections).

According to an embodiment, the contributing frequency may be determined as a resonance frequency in the electromagnetic output signal. Correspondingly, the analysis device may be configured to determine the contributing frequency as a resonance frequency in the electromagnetic output signal.

According to an embodiment, the contributing frequency may be compared with an expected fundamental frequency of the electrically conductive material. Correspondingly, the analysis device may be configured to compare the contributing frequency with an expected fundamental frequency of the electrically conductive material.

The expected fundamental frequency of the electrically conductive material may be defined by at least one of the dimensions, the shape and the material type of the electrically conductive material.

According to an embodiment, the expected fundamental frequency of the electrically conductive material may be determined by analyzing a reference material.

For example, a component may be formed from the electrically conductive material. The component's dimensions and/or shape as well its structure and material composition may determine its resonant frequencies. This frequency spectrum may now be affected by any imperfection present within the component. A reference component (or, "gold standard") may be provided, which has no imperfections, or, only well-known imperfections, and which may now be used as a reference for any other similarly manufactured component.

According to an embodiment, the antenna detection system may comprise an antenna array and/or multiple antennas distributed in space.

Thus, in one example, an antenna array may be employed, i.e. a set of multiple connected antennas working together as a single antenna to transmit or receive radio waves. In that case, the individual antennas or array elements may be connected to a single receiver or transmitter by feedlines that feed the power to the elements in a specific phase relationship. The separate radio frequency currents from the individual antennas combine in the receiver with the correct phase relationship to enhance signals received from the desired directions and cancel signals from undesired directions. Thus, usage of such an antenna array allows to reconstruct the direction of origin of a signal, e.g. the contributing frequencies of the imperfections within the conductive material. More sophisticated array antennas may have multiple transmitter or receiver modules, each connected to a separate antenna element or group of elements.

However, alternatively or additionally, multiple individual antennas distributed in space may be employed, which do not necessarily combine and superpose their individual signals. Nevertheless, the signals of these antennas may be analyzed jointly in order to draw conclusions on the radio signal as a function of direction and/or position. Hence, also in this case, the location of the imperfections may be reconstructed by extracting the spatial origin of the contributing frequencies.

Hence, the antenna detection system may probe the frequency spectrum of the electromagnetic output signal by determining, with the antenna array and/or the multiple antennas distributed in space, a direction where the contributing frequency is coming from.

According to an embodiment, the antenna detection system may comprise at least one antenna configured movable in space.

Thus, alternatively or additionally to an array or field of distributed antennas, also one or several individual antennas may be moved in space in order to reconstruct the antenna signal of the probed material with regards to direction and/or position.

Hence, the antenna detection system may probe the frequency spectrum of the electromagnetic output signal by moving the at least one antenna in space and determining the electromagnetic output signal at different locations.

According to an embodiment, the electrically conductive material may be a carbon-fiber composite.

For example, the electrically conductive material may be a component formed from a carbon-fiber reinforced plastic material. In one particular example, the electrically conductive material may be a structural component of a vehicle, e.g. aircraft, watercraft, ground vehicle, rail vehicle etc. In another example, the electrically conductive material may be a structural component that is part of a machine or building.

According to an embodiment, the imperfection may comprise a delamination, a fiber breakage, a distortion, a void and/or a crack.

For example, the electric properties of CFRP structures vary in accordance with damage such as fiber breakage or delamination. Hence, the damage also affects the properties of the CFRP antenna. By overserving the frequency spectrum of the radiated output signal, the antenna properties due to the damage can be observed wirelessly at a remote location, which in turn allows to draw conclusions on the properties of the imperfection.

As detailed above, a chirp or otherwise frequency-modulated electric input signal may be applied to the electrically conductive material such that the electrically conductive material acts as an antenna and thereby transmits an electromagnetic output signal with a characteristic frequency spectrum. However, alternatively, also other electric input signals may be introduced in the electrically conductive material in an appropriate way. For example, a continuous wave (CW) signal may be utilized. The electrically conductive material may generally be probed with an alternating electromagnetic field as test signal. Radiation emitted and/or absorbed locally by the material may be studied to detect any anomaly within the material.

As another example, a direct current (DC) signal may be employed instead of an alternating current. In case of a DC signal, the signal generator may be connected to two different ends and/or portions of the electrically conductive material. For example, an input may be provided for the electric signal generator at one portion of the electrically conductive material. An output may then be connected to the electrically conductive material at a different portion, e.g. an opposite end, of the material under test.

When using a DC signal as electric input signal, one can use a DC-slider, for example, to localize any imperfection within the material under test. To this end, one can slide over the electrically conductive material and probe the material for existing discontinuities, e.g. by measuring voltage and/or current changes over an outer surface of the material.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
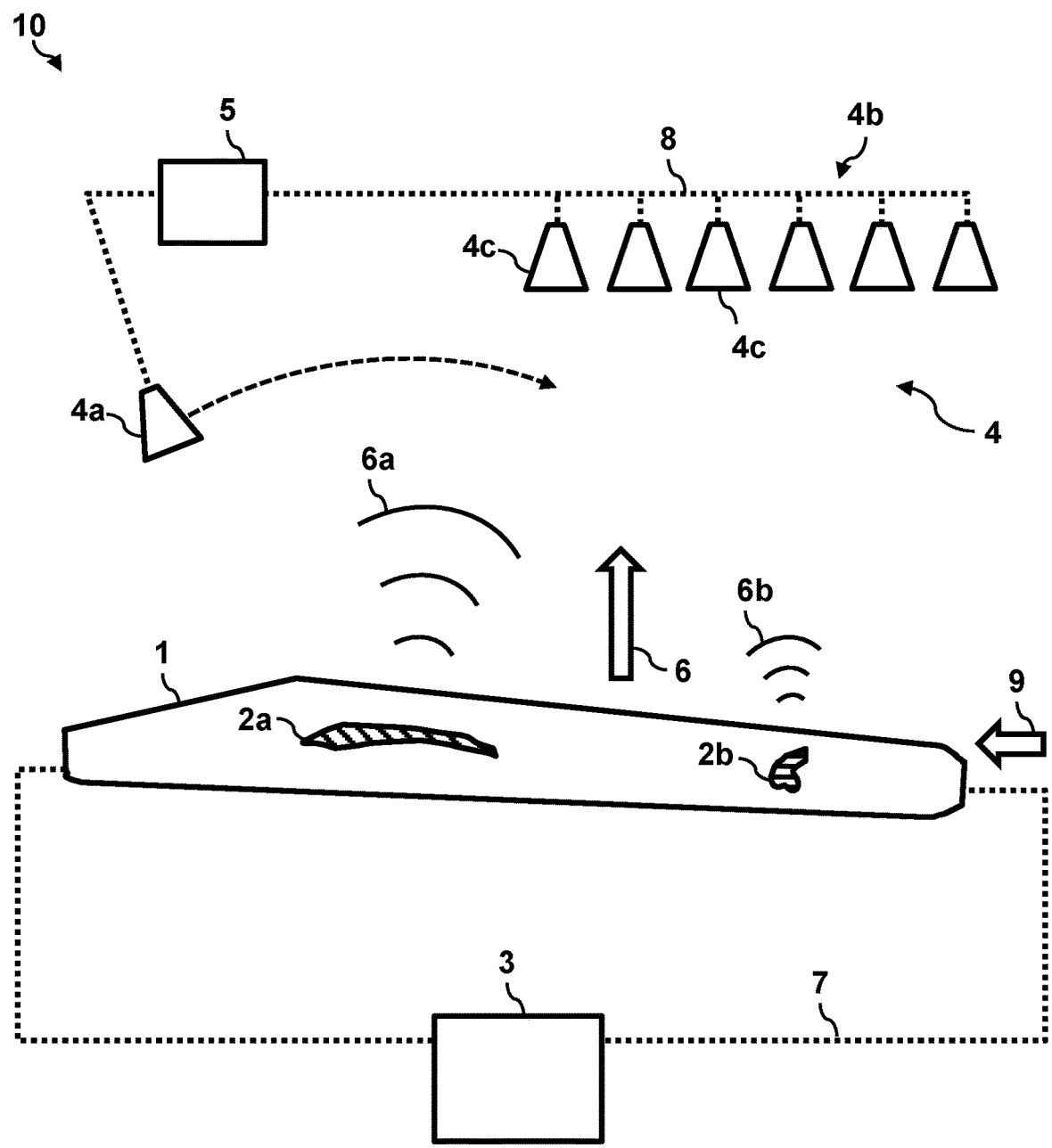
FIG. 1 shows a schematic diagram of an embodiment of a measuring arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 2:
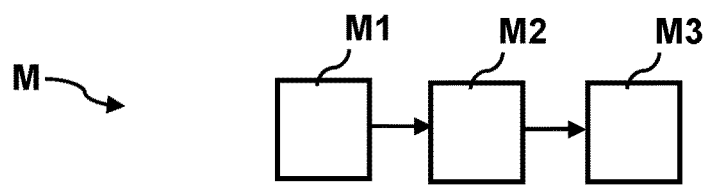
FIG. 2 shows a schematic flow diagram of an embodiment of a measuring method according to the present invention.

FIG. 1 shows a schematic diagram of an embodiment of a measuring arrangement 10 according to the present invention. FIG. 2 depicts a schematic flow diagram of a method M using the arrangement 10 of FIG. 1.

The measuring arrangement 10 and method M are provided for locating imperfections 2a, 2b in an electrically conductive material 1. In the present exemplary embodiment, the electrically conductive material 1 is a carbon-fiber reinforced plastic material, e.g. with a polymer resin as matrix material. In this particular embodiment, the material 1 is formed as a rotor blade (cf. FIG. 1). Possible imperfections 2a, 2b of such a material 1 comprise amongst others delaminations, fiber breakages, distortions, voids, cracks and other defects, flaws and/or deficiencies known to the person of skill in the context of CFRP components.

Carbon fibers are generally characterized by relatively high electrical conductivity, which means that the material 1 conducts electric currents to a certain extent. Hence, an alternating current and/or an alternating electromagnetic field may be introduced in the electrically conductive material 1, whose propagation within the material 1 then depends on the material's 1 properties, in particular the configuration and arrangement of the electrically conductive fibers. More generally, any form of electromagnetic signal may be used to probe the material 1 under test, e.g. also a direct current signal. The behavior of the material 1 under application of electromagnetic fields and currents is moreover affected by the presence of the above imperfections. More specifically, the actual behavior of the material 1 is defined amongst others by the scale (that is, the size) and type of the imperfections.

Typical relevant quality criteria for such fiber composite materials comprise fiber orientation, gaps, wrinkles, overlaps, distortions, undulations, uniformities, as well as aspects related to the matrix including delamination, inclusions, cracks, curing, voids, debonding and so on. Generally, defects and effects in carbon fiber materials are classified according to their location as structural defects (carbon fiber related) and matrix defects (resin related). To characterize the properties of carbon fiber materials, researchers use a set of various different test methods, commonly referred to as carbon fiber testing. The results of the testing are used to aid the manufacturer and developer's decisions selecting and designing material composites, manufacturing processes and for ensured safety and integrity. Safety-critical carbon fiber components, such as structural parts in machines, vehicles, aircraft or architectural elements are subject to testing.

Besides imperfections stemming from the manufacturing process, the performance of composite structures can also be affected by continuous use and exposure to impact events. However, many types of manufacturing defects and in-service damage cannot be properly identified or evaluated by common visual observation. Therefore, various non-destructive testing (NDT) techniques have been applied to identify defects and damage, such as, acoustic emission, ultrasonic testing, eddy current, thermography, shearography, vibration testing, X-ray tomography, optical fiber sensors, Lamb waves, terahertz imaging and microwave techniques.

The presently followed approach makes use of the conductive properties of the carbon fibers within the material 1 to utilize the material and/or component 1 (i.e. the rotor blade in this particular case) as an antenna for transmitting radio waves. The electric properties of the material 1, and thus of the antenna, vary in accordance with the presence and properties of imperfections such as fiber breakage or delaminations. This change in the antenna properties due to imperfections can be observed remotely by analyzing the transmitted electromagnetic radiation, as will be explained in the following.

It will be clear to the person of skill however that also other approaches may be used to probe the material 1 for imperfections. For example, a DC signal may be introduced in the material 1 at one end and an output may be provided at another portion. A DC slider approach may then be used to measure any signal change over an outer surface of the material 1 to detect discontinuities and/or imperfections.

It is also to be understood that the specific configuration shown in FIG. 1 is merely an example. It goes without saying that any other type of component and shape formed from such a conductive material may be analyzed based on the present approach. A rotor blade is merely provided as one simple example. Moreover, also other conductive materials may be studied with the present method and arrangement, e.g. metals and/or metal composite materials.

Referring now to FIG. 2, the method M comprises under M1 applying an electric input signal 9 with an electric signal generator 3 to the electrically conductive material 1 such that the electrically conductive material 1 acts as an antenna and thereby radiates an electromagnetic output signal 6 (i.e. radio waves). The output signal 6 has a frequency spectrum comprising contributing frequencies 6a, 6b corresponding to the imperfections 2a, 2b within the electrically conductive material 1. In other words, the shape and composition of the output signal 6 is not only determined by the general configuration of the material 1 but also by any imperfection present within the material 1.

In order to apply the electric input signal 9, the signal generator 3 is electrically coupled, for example, on two sides to the electrically conductive material 1 via an input signal line 7, as can be seen in FIG. 1, and via suitable contact elements (not shown). The signal generator 3 is configured to provide a frequency-modulated signal, whose signal frequency changes over time. To this end, the signal generator 3 may introduce an alternating current with a given frequency in the material 1. In one particular example, the input signal 9 may be a chirp signal, i.e. the frequency of the signal 9 increases or decreases continuously with time.

This makes it possible to observe the antenna behavior of the electrically conductive material 1 over frequency and to detect resonances within the frequency spectrum, which may correspond to the imperfections 2a, 2b. Generally, any deviations from an expected behavior in the emitted radio waves can be used to draw conclusions about the properties of the material 1 and possible imperfections hidden within it (the radiation spectrum is different from defective areas compared to a flawless structure). Hence, any local anomaly within the emitted radiation may point to a defect within the material 1.

The exemplary embodiment of FIG. 1 comprises two imperfections 2a, 2b, within the electrically conductive material 1, namely a large imperfection 2a (e.g. a delamination, left in FIG. 1) and a small imperfection 2b (e.g. a fiber crack, right in FIG. 1). It is evident that the person of skill will readily conceive a multitude of other configurations that may be studied in a similar vein.

Again referring to FIG. 2, the method further comprises under M2 receiving the electromagnetic output signal 6 with an antenna detection system 4. The antenna detection system 4 of the exemplary embodiment shown in FIG. 1 comprises an antenna array 4b having a plurality of stationary antennas 4c that are coupled to each other and with an analysis device 5 (e.g. a signal evaluation and computing system) via an output signal line 8. The antenna detection system 4 may comprise and/or may be connected to a receiver or the like for demodulating the output signal 6 (not shown). The antenna array 4b may provide the antenna detection system 4 with directional sensitivity.

Additionally, in the present embodiment, the antenna detection system 4 comprises an antenna 4a, e.g. a single broadband antenna, that is configured movable in space (cf. arrow in FIG. 1) to determine the electromagnetic output signal 6 at different locations and thereby probe the output signal 6 not only as a function of position but also of direction.

The antenna detection system 4 is thus configured to probe the frequency spectrum of the electromagnetic output signal 6 as a function of position and direction. It is to be understood however that other embodiments may feature different antenna configurations, e.g. only one or several moving antennas without an additional antenna array. In one alternative example, the antenna detection system 4 may comprise multiple antennas distributed in space to determine the direction where the contributing frequencies are coming from.

Still referring to FIG. 2, the method M further comprises under M3 locating the imperfections 2a, 2b within the electrically conductive material 1 by analyzing with the analysis device 5 a spatial origin of the contributing frequencies 6a, 6b within the frequency spectrum of the received electromagnetic output signal 6. More specifically, the contributing frequencies 6a, 6b are determined as resonance frequencies in the electromagnetic output signal 6 and compared to an expected fundamental frequency of the electrically conductive material 1. Any contributing frequency 6a, 6b that differs from the expected frequency spectrum may point at a corresponding imperfection 2a, 2b or set of imperfections. The expected fundamental frequency may, for example, be derived on basis of a reference material and/or component, which is structurally well known. The expected fundamental frequency may also be determined by the dimensions, shape and/or material of the electrically conductive material 1.

As a result, the present system is able to detect any deviations from an expected frequency spectrum of the output signal 6 by comparing the measured output signal 6 with an expected signal configuration for a give input signal 9. By analyzing the frequency spectrum of the output signal 6, imperfections 2a, 2b within the material 1 can be reconstructed and even localized due to the positional and directional sensitivity of the antenna system 4.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measuring method for locating an imperfection in an electrically conductive material, the method comprising:
applying an electric input signal with an electric signal generator to the electrically conductive material such that the electrically conductive material acts as an antenna and thereby transmits an electromagnetic output signal having a frequency spectrum comprising a contributing frequency corresponding to the imperfection within the electrically conductive material;

receiving the electromagnetic output signal with an antenna detection system, wherein the antenna detection system probes the frequency spectrum of the electromagnetic output signal as a function of at least one of position and direction; and locating the imperfection within the electrically conductive material by analyzing with an analysis device a spatial origin of the contributing frequency within the frequency spectrum of the received electromagnetic output signal;

wherein the antenna detection system probes the frequency spectrum of the electromagnetic output signal by at least one of:

determining, with at least one of an antenna array and multiple antennas distributed in space, a direction where the contributing frequency is coming from, and moving at least one antenna in space and determining the electromagnetic output signal at different locations.

2. The method of claim 1, wherein the electric input signal comprises a frequency-modulated signal.

3. The method of claim 1, wherein a signal frequency of the electric input signal is changed over time.

4. The method of claim 1, wherein the electric input signal is a chirp signal.

5. The method of claim 1, wherein the contributing frequency is determined as a resonance frequency in the electromagnetic output signal.

6. The method of claim 1, wherein the contributing frequency is compared with an expected fundamental frequency of the electrically conductive material.

7. The method of claim 6, wherein the expected fundamental frequency of the electrically conductive material is determined by analyzing a reference material.

8. The method of claim 1, wherein the electrically conductive material is a carbon-fiber composite, wherein the imperfection comprises at least one of a delamination, a fiber breakage, a distortion, a void and a crack.

9. A measuring arrangement for locating an imperfection in an electrically conductive material, the measuring arrangement comprising:

an electric signal generator configured to apply an electric input signal to the electrically conductive material such that the electrically conductive material acts as an antenna and thereby transmits an electromagnetic output signal having a frequency spectrum comprising a contributing frequency corresponding to the imperfection within the electrically conductive material;

an antenna detection system configured to the receive the electromagnetic output signal, wherein the antenna detection system is configured to probe the frequency spectrum of the electromagnetic output signal as a function of at least one of position and direction; and an analysis device configured to locate the imperfection within the electrically conductive material by analyzing a spatial origin of the contributing frequency within the frequency spectrum of the received electromagnetic output signal;

wherein the antenna detection system comprises at least one of:

at least one of an antenna array and multiple antennas distributed in space, wherein the antenna detection system is configured to probe the frequency spectrum of the electromagnetic output signal by determining a direction where the contributing frequency is coming from, and at least one antenna configured movable in space, wherein the antenna detection system is configured to probe the frequency spectrum of the electromagnetic output signal by moving the at least one antenna in space and determine the electromagnetic output signal at different locations.

10. The arrangement of claim 9, wherein the electric input signal comprises a frequency-modulated signal.

11. The arrangement of claim 9, wherein the signal generator is configured to change a signal frequency of the electric input signal over time.

12. The arrangement of claim 9, wherein the electric input signal is a chirp signal.

13. The arrangement of claim 9, wherein the analysis device is configured to determine the contributing frequency as a resonance frequency in the electromagnetic output signal.

14. The arrangement of claim 9, wherein the analysis device is configured to compare the contributing frequency with an expected fundamental frequency of the electrically conductive material.

15. The arrangement of claim 9, wherein the electrically conductive material is a carbon-fiber composite, wherein the imperfection comprises at least one of a delamination, a fiber breakage, a distortion, a void and a crack.

16. A measuring method for locating an imperfection in an electrically conductive material, the method comprising:

applying an electric input signal with an electric signal generator to the electrically conductive material such that the electrically conductive material acts as an antenna and thereby transmits an electromagnetic output signal having a frequency spectrum comprising a contributing frequency corresponding to the imperfection within the electrically conductive material, wherein the signal generator is electrically connected to the electrically conductive material;

receiving the electromagnetic output signal with an antenna detection system, wherein the antenna detection system probes the frequency spectrum of the electromagnetic output signal as a function of at least one of position and direction; and locating the imperfection within the electrically conductive material by analyzing with an analysis device a spatial origin of the contributing frequency within the frequency spectrum of the received electromagnetic output signal.

17. A measuring arrangement for locating an imperfection in an electrically conductive material, the measuring arrangement comprising:

an electric signal generator configured to apply an electric input signal to the electrically conductive material such that the electrically conductive material acts as an antenna and thereby transmits an electromagnetic output signal having a frequency spectrum comprising a contributing frequency corresponding to the imperfection within the electrically conductive material, wherein the signal generator is electrically connected to the electrically conductive material;

an antenna detection system configured to the receive the electromagnetic output signal, wherein the antenna detection system is configured to probe the frequency spectrum of the electromagnetic output signal as a function of at least one of position and direction; and an analysis device configured to locate the imperfection within the electrically conductive material by analyzing a spatial origin of the contributing frequency within the frequency spectrum of the received electromagnetic output signal.

* * * * *